US008159814B2

(12) United States Patent
Wang et al.

(10) Patent No.: US 8,159,814 B2
(45) Date of Patent: Apr. 17, 2012

(54) METHOD OF OPERATING TRANSISTORS AND STRUCTURES THEREOF FOR IMPROVED RELIABILITY AND LIFETIME

(75) Inventors: Ping-Chuan Wang, Hopewell Junction, NY (US); Zhijian Yang, Stormville, NY (US); Fernando J. Guarin, Millbrook, NY (US); J. Edwin Hostetter, Pleasant Valley, NY (US); Kai D Feng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 606 days.

(21) Appl. No.: 12/355,815

(22) Filed: Jan. 19, 2009

(65) Prior Publication Data
US 2010/0182729 A1 Jul. 22, 2010

(51) Int. Cl.
*H01G 7/02* (2006.01)
*G01R 31/04* (2006.01)
(52) U.S. Cl. ............... 361/437; 324/538; 257/E21.591
(58) Field of Classification Search ............... 361/437; 324/538; 257/E21.591
See application file for complete search history.

(56) References Cited

U.S. PATENT DOCUMENTS

| | | | | |
|---|---|---|---|---|
| 6,147,361 A * | 11/2000 | Lin et al. | | 257/48 |
| 6,320,391 B1 * | 11/2001 | Bui | | 324/537 |
| 6,614,251 B2 * | 9/2003 | Ootsuji | | 324/762.01 |
| 6,958,621 B2 | 10/2005 | La Rosa et al. | | |
| 7,238,565 B2 | 7/2007 | Guarin et al. | | |
| 7,298,639 B2 | 11/2007 | Hsu et al. | | |
| 7,858,406 B2 * | 12/2010 | Walter et al. | | 438/18 |
| 2006/0044714 A1 * | 3/2006 | Chen | | 361/56 |
| 2006/0267616 A1 * | 11/2006 | Cranford et al. | | 324/763 |
| 2007/0300200 A1 * | 12/2007 | Hau-Riege et al. | | 716/13 |

OTHER PUBLICATIONS

"An Electromigration Failure Model for Interconnects under Pulsed and Bi-directional Current Stressing," by J. Tao, et al. IEEE Trans. on Electron Devices, vol. 41, No. 4, Apr. 1994, pp. 539-545.

* cited by examiner

*Primary Examiner* — Jared Fureman
*Assistant Examiner* — Scott Bauer
(74) *Attorney, Agent, or Firm* — Yuanmin Cai

(57) ABSTRACT

Embodiments of the present invention provide a semiconductor device that includes a transistor device having a first, a second, and a third node; and an interconnect structure having at least one wire and the wire having a first and a second end with the first end of the wire being connected to one of the first, the second, and the third node of the transistor device. The wire is conductive and adapted to provide an operating current in a first direction during a normal operating mode, and adapted to provide a repairing current in a second direction opposite to the first direction during a repair mode of the semiconductor device. In one embodiment the transistor device is a bipolar transistor with the first, second, and third nodes being an emitter, a base, and a collector of the bipolar transistor. The wire is connected to one of the emitter and the collector. Method of operating the semiconductor device and current supplying circuit for the semiconductor device are also disclosed.

27 Claims, 9 Drawing Sheets

METHOD OF OPERATING TRANSISTORS AND STRUCTURES THEREOF FOR IMPROVED RELIABILITY AND LIFETIME

FIELD OF THE INVENTION

The present invention relates to the field of semiconductor device and related supporting circuit manufacturing and, in particular, relates to method for improving reliability and lifetime of transistors, such as bipolar transistors, and structures thereof.

BACKGROUND OF THE INVENTION

As performance of semiconductor devices such as transistors, for example, silicon-germanium (SiGe) heterojunction bipolar transistors (HBT) continues to excel and clock speed or bandwidth of the transistors passes for example a few tens of GHz, demand on electric current supply for the transistors is generally expected to exceed the present DC current carrying capability of back-end-of-line (BEOL) metal interconnects, if the transistors are expected to continue achieving their desired and in certain instances optimum performance. For example, with the latest 200-GHz speed SiGe HBT devices that employ latest copper (Cu) wiring technology, demand on electric current supply may go as high as 6.5 mA/$\mu$m$^2$ in density inside the related BEOL metal interconnects.

In the meantime, in order for transistors in particular HBT devices to operate reliably over their entire lifetime, under an ambient temperature of potentially as high as around 125 degree Celsius, the maximum current that present BEOL metal interconnects may be able to provide support or tolerate is estimated around 2 to 4 mA/$\mu$m$^2$, depending on whether redundant stud contacts are used or not.

Obviously, if the HBT devices are routinely operated at close to a 6.5 mA/$\mu$m$^2$ current density level in order to achieve their best possible performance, this over-the-limit high current density level may affect reliability of the HBT devices and ultimately cause shortened lifetime of the devices. It is evident that present BEOL metal interconnects or metal wirings are no longer capable of providing adequate support for the increasing demand of high current density (with device self-heating taken into account) that are necessary for proper operation of both recent and future generations of HBT devices.

Over the time, through carefully analysis of this device reliability issue which appears arising from the use of high current density, it becomes apparent to the applicants that one possible cause for this reliability concern may be attributed to an electro-migration phenomenon often observed in the metal interconnects. Electro-migration (EM) is known as a metal atom diffusion process in the presence of electron wind under DC bias condition. In the case of transistors being used under high current density, the electro-migration may induce void of a metal contact or wire at the cathode end, potentially causing an electrical open, and/or induce extrusion of a similar metal contact or wire at the anode end, potentially causing an electrical short. EM is also known as a thermally activated process that normally gets accelerated at elevated temperatures. In the case of a transistor, elevated temperature may be caused by, for example, device self-heating under even normal operating conditions.

FIG. 1A and FIG. 1B are demonstrative illustrations of simulated junction temperatures of different bipolar transistors and simulated limits of allowable electric current that may be supported by their related metal interconnects. For example, FIG. 1A illustrates different junction temperatures of transistors with different junction areas (101, 102, 103), at different power density levels of current. It is apparent that the junction temperature increases almost linearly with the increase in power density as well as with the increase in junction area (101-103). The dramatic increase in temperature is indicative that EM related reliability of metal interconnects or metal wirings shall be a concern for most circuitry designers. The level of sensitivity of EM related device performance degradation versus junction temperature of the device is illustrated in FIG. 1B by virtue of changes in DC current limit. For example, EM related device degradation may increase by a factor of five (5) by a temperature change of merely 25 degrees, from 100 C to 125 C, because the temperature change causes an approximately 80 percent decrease in DC current limit in the metal interconnects.

FIGS. 2A and 2B are demonstrative illustrations of interfaces at near collector contact and emitter contact of a typical HBT device with and without EM damages as is known in the art. For example, FIG. 2A is an illustrative showing of a HBT 200, together with its top view, before any EM damage occurs. HBT 200 may be supplied with an electric current which flows from emitter wire 201 to collector wire 202. After being operated for a certain period of time and in particular when the operation being under elevated temperatures, EM damages may start to occur in the emitter and collector contact regions of HBT 200. In particular, the EM damages may be around interface areas of between metal level one (M1), such as emitter wire 201 and collector wire 202, and contact areas (CA) of HBT device 200 as these areas are most susceptible to EM damage. For example, FIG. 2B illustrates that voiding occurs at the collector contact region (292) and extrusion occurs at the emitter contact region (291), both near the contact area (CA) of HBT device 200.

SUMMARY OF EMBODIMENTS OF THE INVENTION

Embodiments of the present invention provide a method of operating a semiconductor device. In one embodiment, the method includes operating the semiconductor device for a first period of time at a normal operating mode; recording conditions of the semiconductor device during the first period of time; operating the semiconductor device for a second period of time at a repair mode after the first period of time at the normal operating mode, with the repair mode being different from the normal operating mode; and operating the semiconductor device for a third period of time at the normal operating mode after the second period of time at the repair mode.

According to one embodiment, operating the semiconductor device at the normal operating mode includes applying an operating current in a first direction to the semiconductor device; and operating the semiconductor device at the repair mode includes applying a repairing current in a second direction to the semiconductor device with the second direction being opposite to the first direction.

In one embodiment, the semiconductor device includes a bipolar transistor having an emitter, a base, and a collector; and a collector wire (CW) having a first and a second end with the first end of the CW being connected to the collector, and applying the operating current in the first direction includes receiving the operating current from the bipolar transistor by the second end of the CW, through the collector and the first end of the CW, during the normal operating mode, and applying the repairing current in the second direction includes providing the repairing current from the second end of the CW to the first end of the CW during the repair mode.

In another embodiment, the semiconductor device includes a bipolar transistor having an emitter, a base, and a collector; and an emitter wire (EW) having a first and a second end with the first end of the EW being connected to the emitter, and applying the operating current in the first direction includes providing the operating current from the second end of the EW to the bipolar transistor, through the first end of the EW and the emitter, during the normal operating mode, and applying the repairing current in the second direction includes providing the repairing current from the first end of the EW to the second end of the EW during the repair mode.

In one embodiment, the semiconductor device includes a bipolar transistor having an emitter, a base, and a collector; and a collector wire (CW) having a first and a second end with the first end of the CW being connected to the collector, and applying the operating current in the first direction includes providing the operating current from the second end of the CW to the bipolar transistor, through the first end of the CW and the collector, during the normal operating mode, and applying the repairing current in the second direction includes providing the repairing current from the first end of the CW to the second end of the CW during the repair mode.

In another embodiment, the semiconductor device includes a bipolar transistor having an emitter, a base, and a collector; and an emitter wire (EW) having a first and a second end with the first end of the EW being connected to the emitter, and applying the operating current in the first direction includes receiving the operating current from the bipolar transistor by the second end of the EW, through the emitter and the first end of the EW, during the normal operating mode, and applying the repairing current in the second direction includes providing the repairing current from the second end of the EW to the first end of the EW during the repair mode.

In one embodiment, the semiconductor device includes a bipolar transistor having an emitter, a base, and a collector; and operating the semiconductor device at the repair mode includes heating the emitter with a poly wire heater disposed directly on top of the emitter of the bipolar transistor.

According to one embodiment, the method includes calculating a wearout amount (WA) caused during the first period of time at the normal operating mode; calculating a repair amount (RA) provided during the second period of time at the repair mode; recording a net wearout amount (NWA) by subtracting the RA from the WA; and terminating the repair mode, if the NWA drops below a pre-determined value, making the second period of time shorter than a time period available from the end of the first period of time to the beginning of the third period of time.

According to another embodiment, the method further includes calculating a new WA caused during the third period of time at the normal operating mode; calculating a new NWA by adding the new WA to the NWA; and operating the semiconductor device at the repair mode if the new NWA is above the pre-determined value at an end of the third period of time.

In one embodiment, the WA is calculated from the conditions recorded during the first period of time at the normal operating mode, the conditions including at least an amount of the operating current, a temperature of the semiconductor device during the normal operating mode, and a duration of the first period of time; and the RA is calculated based upon at least an amount of the repairing current, a temperature of the semiconductor device during the repair mode, and a duration of the second period of time.

Embodiments of the present invention provide a semiconductor device including a transistor device having a first, a second, and a third node; and an interconnect structure having at least one wire, the wire having a first and a second end, the first end of the wire being connected to one of the first, the second, and the third node. The wire is conductive and adapted to provide an operating current in a first direction during a normal operating mode of the semiconductor device, and adapted to provide a repairing current in a second direction opposite to the first direction during a repair mode of the semiconductor device.

According to one embodiment, the transistor device is a bipolar transistor with the first node being an emitter, the second node being a base, and the third node being a collector, wherein the wire is a collector wire (CW) and the first end of the CW being connected to the collector. The semiconductor device includes a collector repairing wire (CRW) being conductively attached to the CW at substantially close to the first end of the CW. In one embodiment, the first end of the CW is connected to the collector of the bipolar transistor vertically through a collector via in-between, and the CRW is substantially vertically aligned with the collector of the bipolar transistor.

The second end of the CW is adapted to receive the operating current from the bipolar transistor through the collector via and through the first end of the CW during the normal operating mode; and adapted to provide the repairing current to the CRW through the first end of the CW during the repair mode. Likewise, the second end of the CW is also adapted to provide the operating current to the bipolar transistor through the first end of the CW and through the collector via during the normal operating mode; and adapted to receive the repairing current from the CRW through the first end of the CW during the repair mode.

According to another embodiment, the transistor device is a bipolar transistor with the first node being an emitter, the second node being a base, and the third node being a collector, wherein the wire is an emitter wire (EW) and the first end of the EW being connected to the emitter. The semiconductor device includes an emitter repairing wire (ERW) being conductively attached to the EW at substantially close to the first end of the EW. In one embodiment, the first end of the EW is connected to the emitter of the bipolar transistor vertically through an emitter via in-between, and the ERW is substantially vertically aligned with the emitter of the bipolar transistor.

The second end of the EW is adapted to provide the operating current to the bipolar transistor through the first end of the EW and through the emitter via during the normal operating mode; and adapted to receive the repairing current from the ERW through the first end of the EW during the repair mode. Likewise, the second end of the EW is also adapted to receive the operating current from the bipolar transistor through the emitter via and through the first end of the EW during the normal operating mode; and adapted to provide the repairing current to the ERW through the first end of the EW during the repair mode.

According to yet another embodiment, the transistor device is a bipolar transistor having an emitter of the first node, a base of the second node, and a collector of the third node, wherein the wire is an emitter wire (EW) and the first end of the EW is connected to the emitter of the bipolar transistor vertically through an emitter via in-between. The semiconductor device also includes a poly wire heater being disposed directly on top of the emitter of the bipolar transistor.

In one embodiment, the poly wire heater is extended to have a first end and a second end with the emitter via being directly on top of the first end of the poly wire heater, and the extended poly wire heater is adapted to provide the repairing current from the second end of the poly wire heater to the second end of the EW, through the first end of the poly wire heater; the emitter via; and the first end of the EW, during the repair mode. In another embodiment, the poly wire heater is extended to have a first end and a second end with the emitter via being directly on top of the first end of the poly wire heater, and the extended poly wire heater is adapted to provide the repairing current from the second end of the EW to the second end of the poly wire heater, through the first end of the EW; the emitter via; and the first end of the poly wire heater, during the repair mode.

Embodiments of the present invention further provide an electric circuit, which includes at least one semiconductor device, the semiconductor device having a transistor device and an interconnect structure providing electric current to the transistor device, the interconnect structure having a collector wire (CW) connected to a collector of the transistor device and an emitter wire (EW) connected to an emitter of the transistor device; and at least one current supplying circuit electrically connected to at least one of the CW and the EW, wherein the current supplying circuit is adapted to provide an operating current to the transistor device in a first direction and a repairing current in a second direction opposite to the first direction, through the at least one of the CW and the EW.

BRIEF DESCRIPTION OF THE DRAWINGS

The present invention will be understood and appreciated more fully from the following detailed description of the invention, taken in conjunction with the accompanying drawings of which.

Figure 1A:
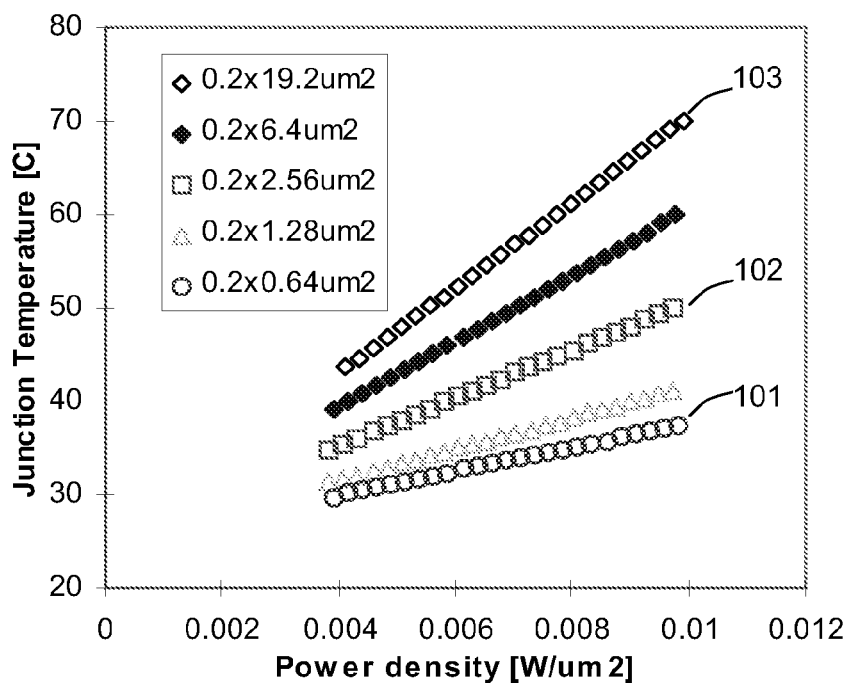
FIGS. 1A and 1B are demonstrative illustrations of simulated junction temperatures of different bipolar transistors and simulated limits of allowable electric current supported by metal interconnect.
Figure 1B:
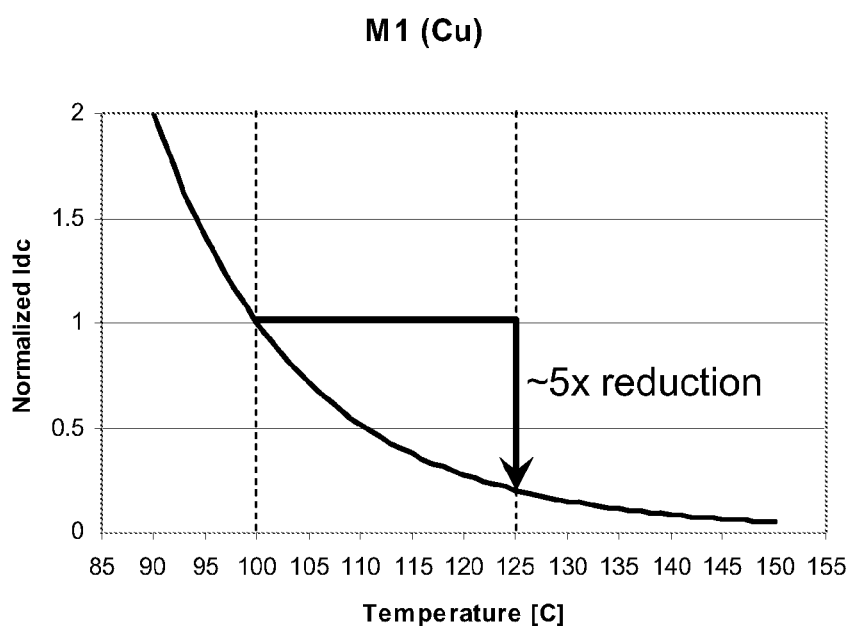
Figure 2A:
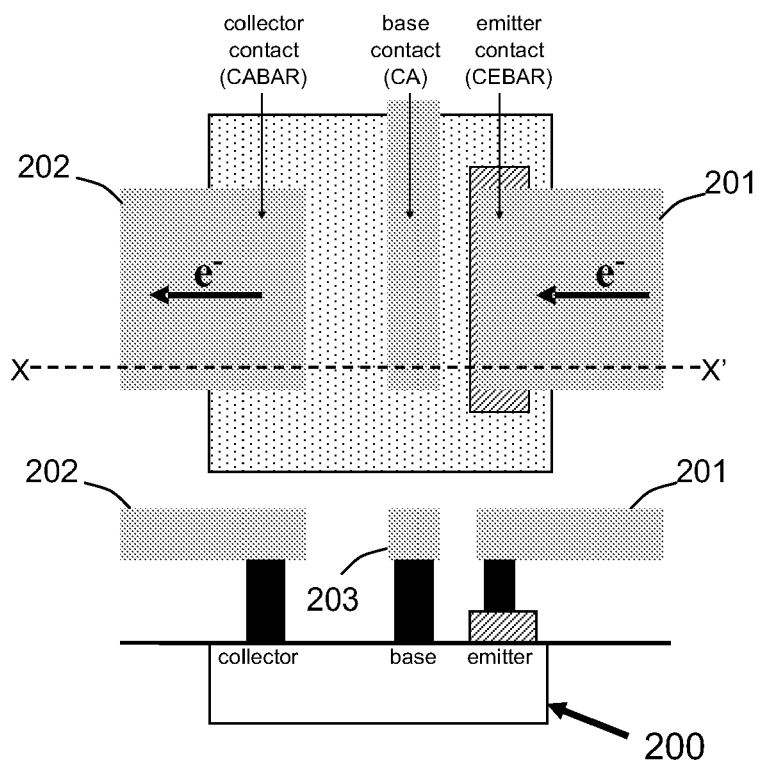
FIGS. 2A and 2B are demonstrative illustrations of interfaces at near collector contact and emitter contact of a typical HBT device with and without EM damages as is known in the art.
Figure 2B:
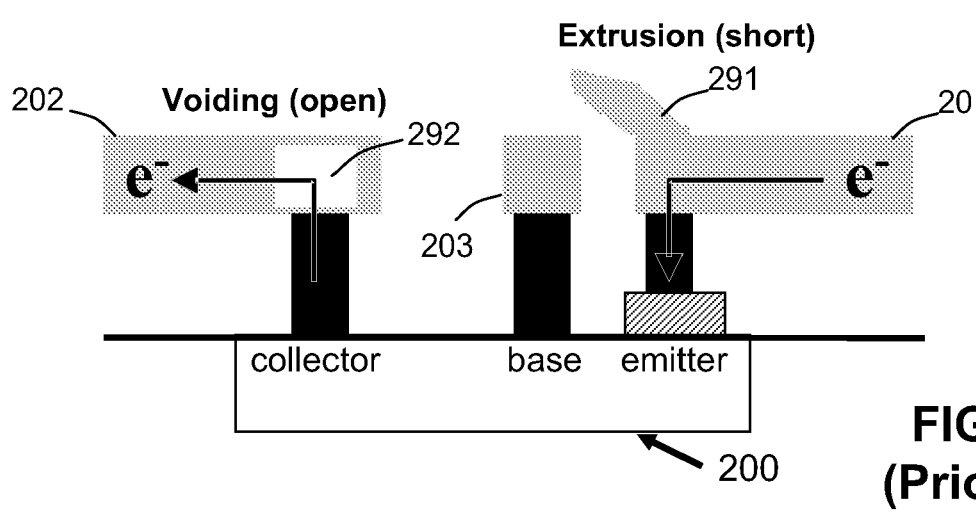

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

In the following detailed description, well-known device processing techniques and/or steps may not be described in detail and, in some instances, may be referred to other published articles or patent applications in order not to obscure the description of the essence of presented invention as further detailed herein below.

Figure 3:
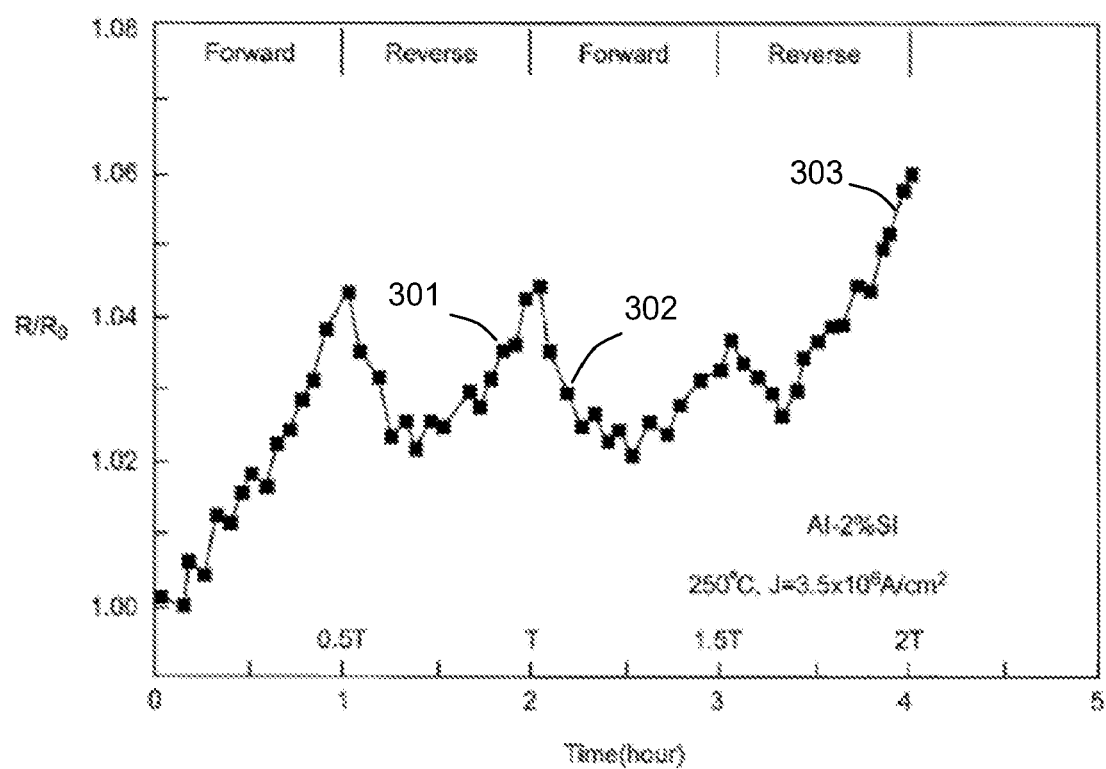
FIG. 3 is a sample test result of an EM related experiment of a metal interconnect according to embodiments of the present invention.

FIG. 3 is a sample test result of an EM related experiment of a metal interconnect according to embodiments of the present invention. Generally, EM related damages may be recovered, at least partially, by changing conditions of electric current going through the metal interconnect. For example, by reversing DC bias thus sweeping electrons in a direction opposite to electron flow under a normal operating mode, migrated metal atoms (caused during normal operating mode) may be "pushed" back towards voided regions in the metal contact. As a result, damages of the EM may be healed at least to some extent. The experiment shown in FIG. 3 was conducted to establish an EM failure model for an interconnect structure made of aluminum and was conducted under both pulsed and bi-direction current stresses. In FIG. 3, y-axis denotes normalized resistances of the metal interconnect under test while x-axis denotes time passing with different bias conditions. FIG. 3 clearly demonstrates that EM processes are generally reversible processes, as being illustrated by the change in resistance, for example, during reverse bias stage 301 and during forward bias stage 302. It is also observed that a massive wearout 303 eventually occurred after several iteration of bias condition alternation. This massive wearout may be caused by, for example, plastic deformation and ILD cracking in the interconnect structure.

In view of the above observation, embodiments of the present invention provide a structure, and method of operation, of semiconductor devices involving transistor devices with extended lifetime and improved reliability. More specifically, embodiments of the present invention provide a method and procedure of operation of the semiconductor devices to recover interconnect structure thereof from EM-induced damage, at least partially and in most cases substantially, when the semiconductor devices are inactive and/or under sleep/standby mode, and/or between two normal operating modes.

More specifically, embodiments of the present invention provide a semiconductor device, such as those involving transistors and particularly bipolar transistors, with "extra" contacts and/or wires in addition to their normal contacts and/or wires (i.e., collector wire, emitter wire, and base wire), such that a reverse bias current may be applied to the semiconductor device for recovery operation of their EM related damages. As being described below in more details with reference to FIGS. 4A and 4B and FIGS. 5A and 5B, in one embodiment, "extra" contacts or wires may be provided to the collector side (and/or emitter side) of the transistor device such that a reverse DC current may be applied to pass through the collector wire (and/or emitter wire) of the device, when the device is not active, and to heal possible EM damages therein. In another embodiment, the emitter poly wire commonly found in a HBT device may be extended for use as an extra wire in reverse biasing. It shall be noted that a poly-silicon stripe at the emitter side, also known as emitter poly or poly wire, has been demonstrated as an on-chip heater to effectively raise device temperature locally. Therefore, the extended emitter poly may also serve as a heating element, a poly wire heater, and be able to accelerate the EM recovery process according to yet another embodiment of the present invention.

Figure 4A:
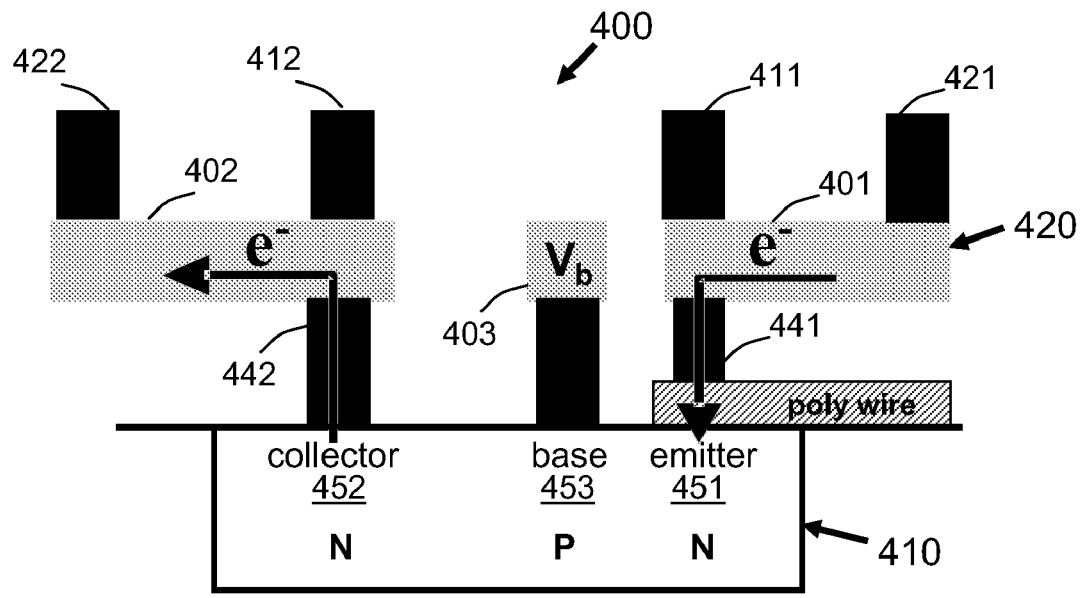
FIGS. 4A and 4B are demonstrative illustrations of a method of operating a semiconductor device according to one embodiment of the present invention.
Figure 4B:
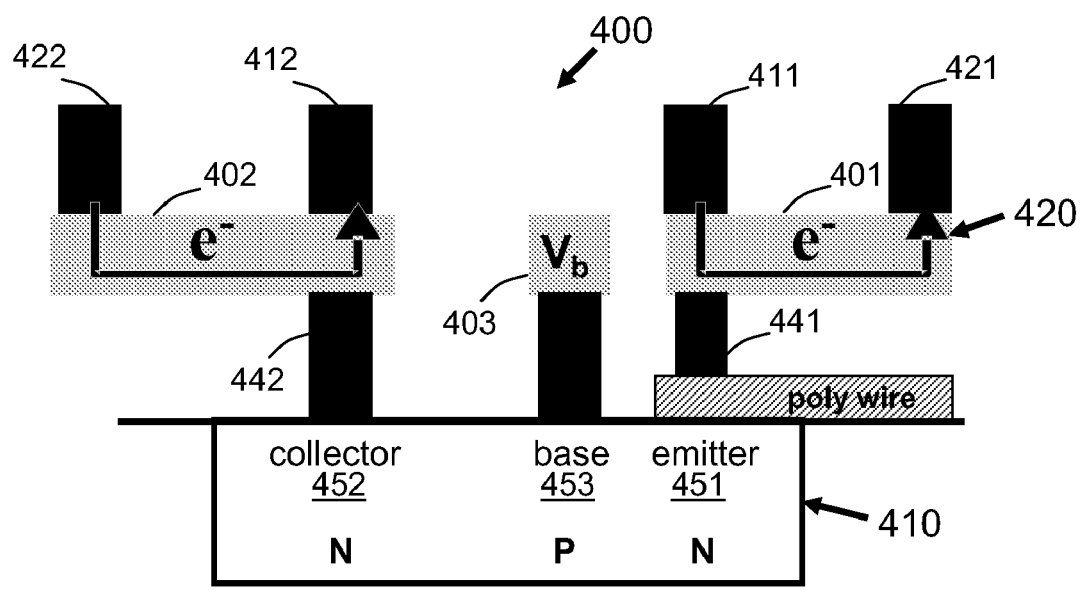

FIGS. 4A and 4B are demonstrative illustrations of a method of operating a semiconductor device according to one embodiment of the present invention. Semiconductor device 400 may include a transistor device 410, which may be for example a heterojunction bipolar transistor (HBT), and a conductive interconnect structure 420 connecting to an emitter 451, a base 453, and a collector 452 of transistor device 410. Here, a person skilled in the art shall appreciate that the present invention is not limited to HBT transistors and their interconnect structures. Embodiments of the present invention may be applied to interconnect structures of various different types, and for interconnect structures used for semiconductor devices of other types such as, field-effect-transistors (FET) or complimentary metal-oxide semiconductor field-effect-transistors (CMOS-FET), to list a few.

During normal operation, at the emitter side electrons of DC bias current may pass through M1 metal interconnect of an emitter wire 401 and flow toward emitter 451, as indicated by the arrow in FIG. 4A. Similarly at the collector side, electrons may flow from collector 452 towards a collector wire 402 of M1 metal interconnect. The process of electron flow may be controlled or regulated by a voltage applied to base 453 through a base contact or base wire 403. Additionally, emitter 451 of transistor 410 may be an n-type emitter and collector 452 may be an n-type collector, while base 453 may be a p-type base (NPN-type transistor). However, embodiments of the present invention are not limited in this respect of transistor type and other types of doped emitter and/or doped collectors of transistors are fully contemplated as well. For example, embodiments of the present invention may equally be applied to a transistor or HBT device with a p-type doped emitter, a p-type doped collector, and an n-type doped base (PNP-type transistor).

As being described above, during normal operation, extrusion may be formed at the emitter side and void may be created at the collector side of transistor 410 after a certain period of time of usage. Consequently, continuous usage of the device or transistor without proper mitigation of the damages may result in shortened lifetime of the device and/or create reliability concerns. According to one embodiment of the present invention, a method is provided which includes operating semiconductor device 400, during its standby mode or sleep mode, in a "repair" mode or "repair" condition, to address above concerns and/or issues. More specifically, the operation may include operating semiconductor device 400 in a "reverse active mode" as being illustratively shown in FIG. 4B.

According to one embodiment of the present invention, conductive interconnect structure 420 of semiconductor device 400 may include "extra" metal contacts or wires 411 and 412 that are formed to be substantially vertically aligned with an emitter via 441 and a collector via 442, respectively, at locations substantially close to a first end of emitter wire 401 and a first end of collector wire 402, respectively. Emitter via 441 and collector via 442 connect directly to emitter 451 and collector 452 of transistor 410 respectively. In other words, metal wires 411 and 412 may be formed on top of emitter wire 401 and collector wire 402 and be substantially vertically aligned with underneath emitter 451 and collector 452 respectively.

Under "reverse active mode" which may be known as operating semiconductor device 400 under a repair mode, direction of the electric current flow (in terms of electron flow) may be reversed as is shown in FIG. 4B. More specifically, at emitter 451 side, electrons may flow from metal contact 411 to a second end of emitter wire 401 via the first end thereof and, at collector 452 side, electrons may flow from a second end of collector wire 402 via the first end thereof to metal contact 412. In one embodiment, metal contacts may be optionally formed at the second ends of emitter wire 401 and collector wire 402 that are away from emitter via 441 and collector via 442. For example, metal contact 421 may be formed in contact with emitter wire 401 at the second end thereof and away from metal contact 411. Similarly, metal contact 422 may be formed in contact with collector wire 402 at the second end thereof and away from metal contact 412. Consequently, electrons may flow from metal contact 411 to metal contact 421 through emitter wire 401 at the emitter side, and flow from metal contact 422 to metal contact 412 through collector wire 402 at the collector side. It shall be noted that self-heating may still occur under this reverse bias conditions, similar to what occurs under normal operating mode since self-heating only scales with the power consumption and does not depend on the polarity of current flow. However, self-heating helps accelerate the reverse EM process for healing and recovering interconnect structure 420 from damages caused during normal operation of transistor 410 according to one embodiment of the present invention.

Figure 5A:
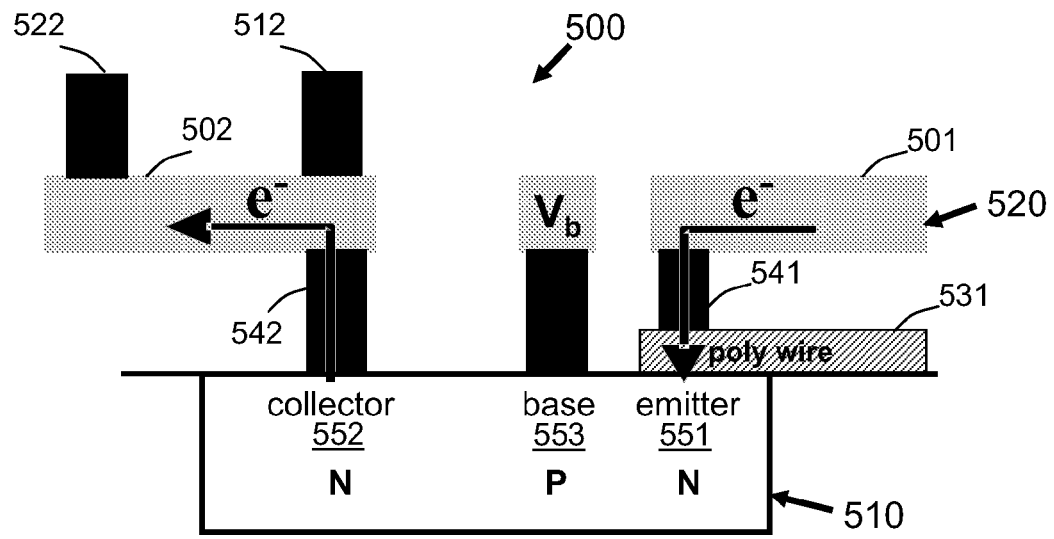
FIGS. 5A and 5B are demonstrative illustrations of a method of operating a semiconductor device according to another embodiment of the present invention.
Figure 5B:
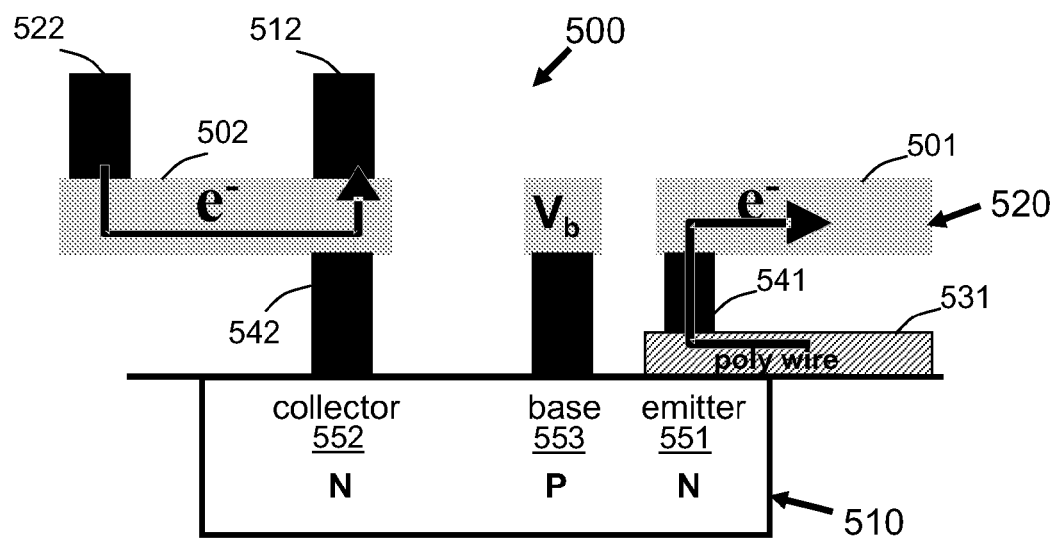

FIGS. 5A and 5B are demonstrative illustrations of a method of operating a semiconductor device according to another embodiment of the present invention. Semiconductor device 500 may include a transistor 510 and a conductive interconnect structure 520 that are formed to provide current support for operation of transistor 510. During normal operation or normal operating mode, electrons of DC bias current may pass through an emitter wire 501 of metal interconnect and flow toward a collector wire 502 of metal interconnect, through an emitter 551 and a collector 552. The process of electron flow may be controlled or regulated by a voltage applied to a base 553 of transistor 510.

As being described above, extrusion may be formed at the emitter side and void may be created at the collector side of transistor 510 after a certain period of time of normal usage, and continued use without attending to damages caused by EM process may eventually result in shortened lifetime of transistor 510. According to one embodiment of the present invention, transistor 510 may be operated, during one or more of its standby mode or sleep mode, in a "repair" mode or "repair" condition. More specifically transistor 510 may be operated at a "reverse active mode" as being shown in FIG. 5B.

According to one embodiment of the present invention, at the collector 552 side, conductive interconnect structure 520 may include a metal contact 512 being formed on top of a first end of collector wire 502 and being substantially vertically aligned with a collector via 542. Collector via 542 leads to collector 552 of transistor 510. At the emitter 551 side, emitter wire 501, having a first end and a second end, may be connected to emitter 551 at the first end through an emitter via 541, with the second end thereof being the end away from emitter via 541. Additionally, semiconductor device 500 may include a poly wire 531 formed directly top of emitter 551 of transistor 510. Poly wire 531 may be an enhanced and extended poly wire being adapted to provide a conductive electron path along its surface, and may also serve to heat emitter 551 and referred as a poly wire heater.

Under "reverse active mode", direction of the electric current flow (in terms of electron flow) may be reversed as is shown in FIG. 5B. For example, at emitter 551 side, electrons may flow from poly wire 531, through emitter via 541 and the first end of emitter wire 501, to the second end of emitter wire 501. At collector 552 side, electrons may flow from the second end of collector wire 502 to metal contact 512, through the first end of collector wire 502. In one embodiment, a metal contact 522 may be optionally formed in contact with the second end of collector wire 502, away from metal contact 512. Thus, electrons may flow from metal contact 522 to metal contact 512 via collector wire 502 during the "repair" mode or "repair" condition.

As being described above, embodiments of the present invention may also be applied to type of transistor devices having a p-type emitter, a p-type collector, and an n-type base (PNP-type transistor). When being applied to a semiconductor device having a PNP-type transistor, during a normal operating mode directions of the normal operating current flow may be opposite to those, as being described above with reference to FIG. 4A and FIG. 5A, that have a NPN-type transistor. Therefore, according to embodiments of the present invention, during a repair mode, directions of the repairing current may also be opposite to those, as being described above with reference to FIG. 4B and FIG. 5B, that have a PNP-type transistor. However, detailed description of operations of semiconductor devices having the PNP-type transistor will be omitted for clarity purpose.

Figure 6:
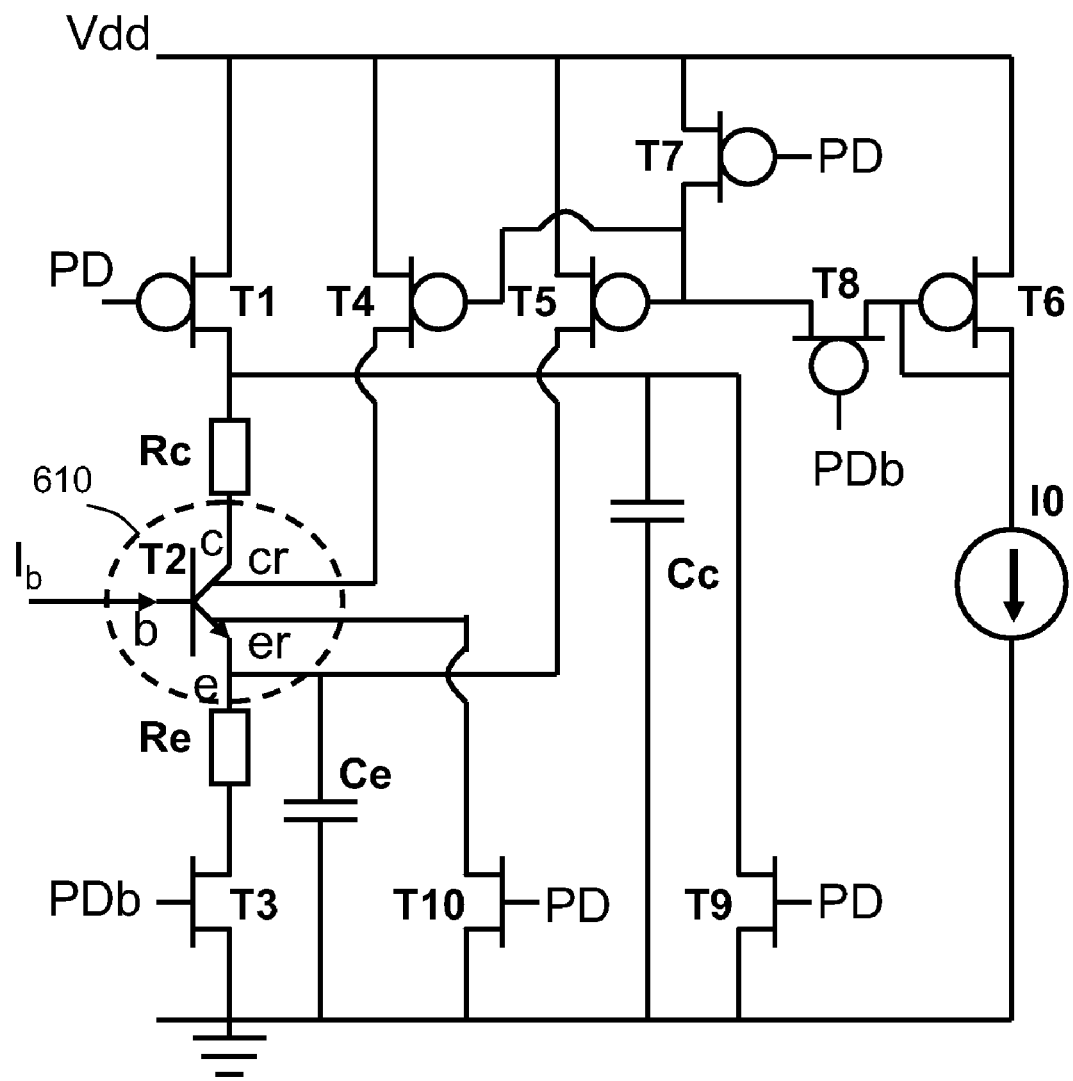
FIG. 6 is a simplified illustration of an electric circuit diagram employing a semiconductor device with repair functionality according to one embodiment of the present invention.

FIG. 6 is a simplified illustration of an electric circuit diagram employing a semiconductor device with repair functionality according to one embodiment of the present invention. In FIG. 6, the semiconductor device may be a transistor 610 (T2). More specifically, FIG. 6 illustrates transistor 610 (T2) which may have more than the regular three, for example five, terminals designed to perform repair function during sleep mode or standby mode of transistor T2. The five terminals may include, for example, a base (b), an emitter (e), a collector (c), a collector repair (cr), and an emitter repair (er).

In configuration, collector of T2 is connected to a pFET T1 through a load resistor Rc and emitter of T2 is connected to an nFET T3 through an emitter resistor Re. During operation, a pair of complementary logic signals "PD" and "PDb" may be applied to pFET T1 and nFET T3 respectively to control the operation of transistor T2. In addition, pFETs T4, T5 and T6 may form a current mirror with enable/disable function with T6 being at the primary side of the current mirror, connected to a current source I0, and T4, T5 being at the secondary side of the current mirror, providing repairing currents for both collector wire and emitter wire, respectively. Further in addition, transistors T7 and T8 are pFETs which enable/disable the controlling of transistor T2. Moreover, transistors T9 and T10 are nFETs and, together with T3, may be used for switch control of repairing current. T3, T7, T8, T9 and T10 are all controlled by complementary logic signals PD and PDb.

Figure 7:
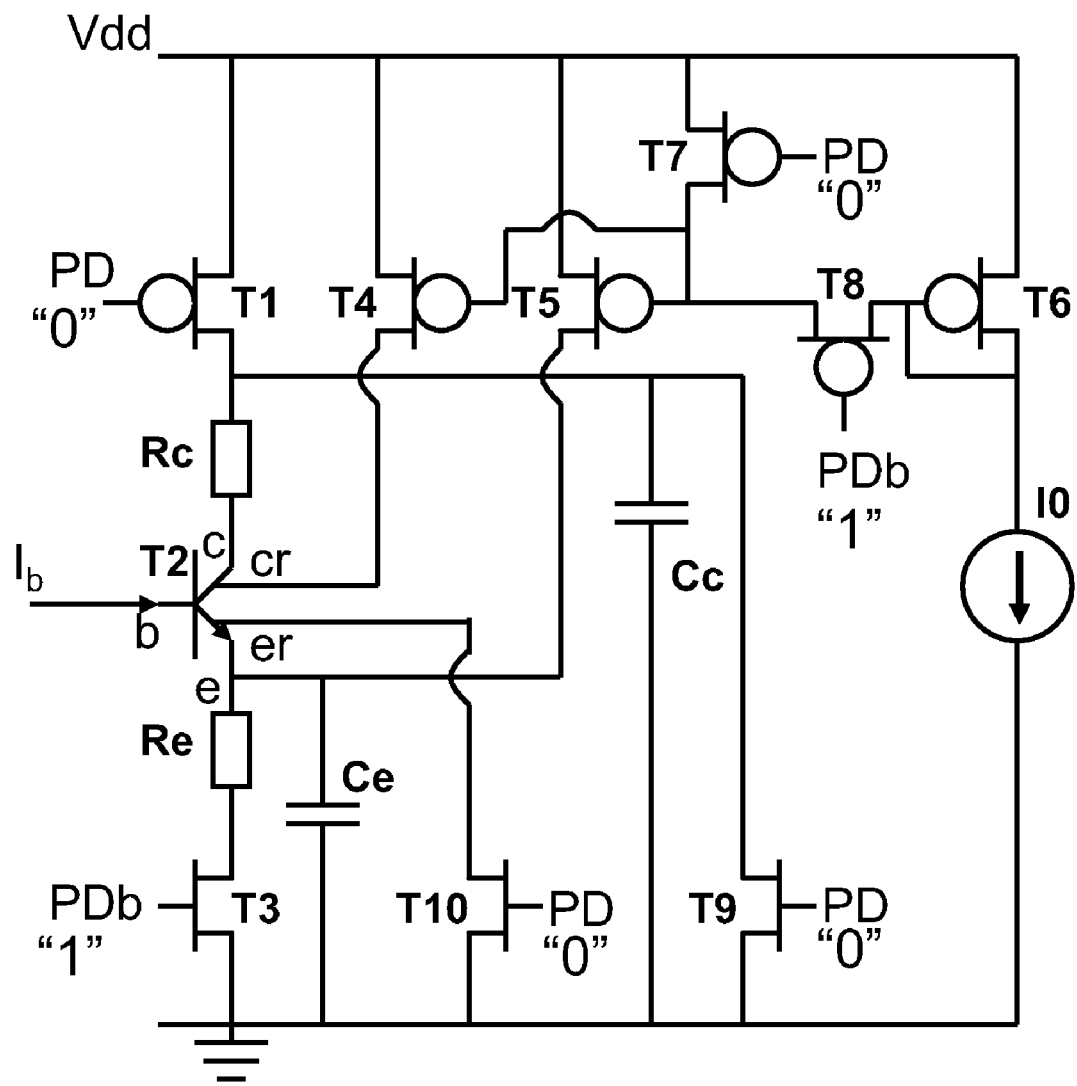
FIG. 7 is a simplified illustration of operation of the electric circuit shown in FIG. 6 during normal operation mode according to one embodiment of the present invention.

FIG. 7 is a simplified illustration of operation of the electric circuit shown in FIG. 6 during normal operation mode according to one embodiment of the present invention. More specifically, during normal operation, logic signal PD is at a logic low ("0") level or state while its complementary counterpart PDb is at a logic high ("1") level or state. As a result, T1 and T3 may be turned on to supply voltage (Vdd) to T2 and thus resistant Re may be effectively connected to ground (due a very small drop in voltage from source to drain of T3). The logic low ("0") PD applied to T7 also turns T7 on, while the logic high ("1") PDb applied to T8 turns T8 off, which makes the current mirror disenable. Consequently, T4 and T5 are turned off and no repairing current is provided to T2. In addition, T9 and T10 are turned off by the logic low ("0") PD signal and the repairing current paths are cut off. Since T1 and T3 are both turned on, T2 may operate under normal operating condition.

Figure 8:
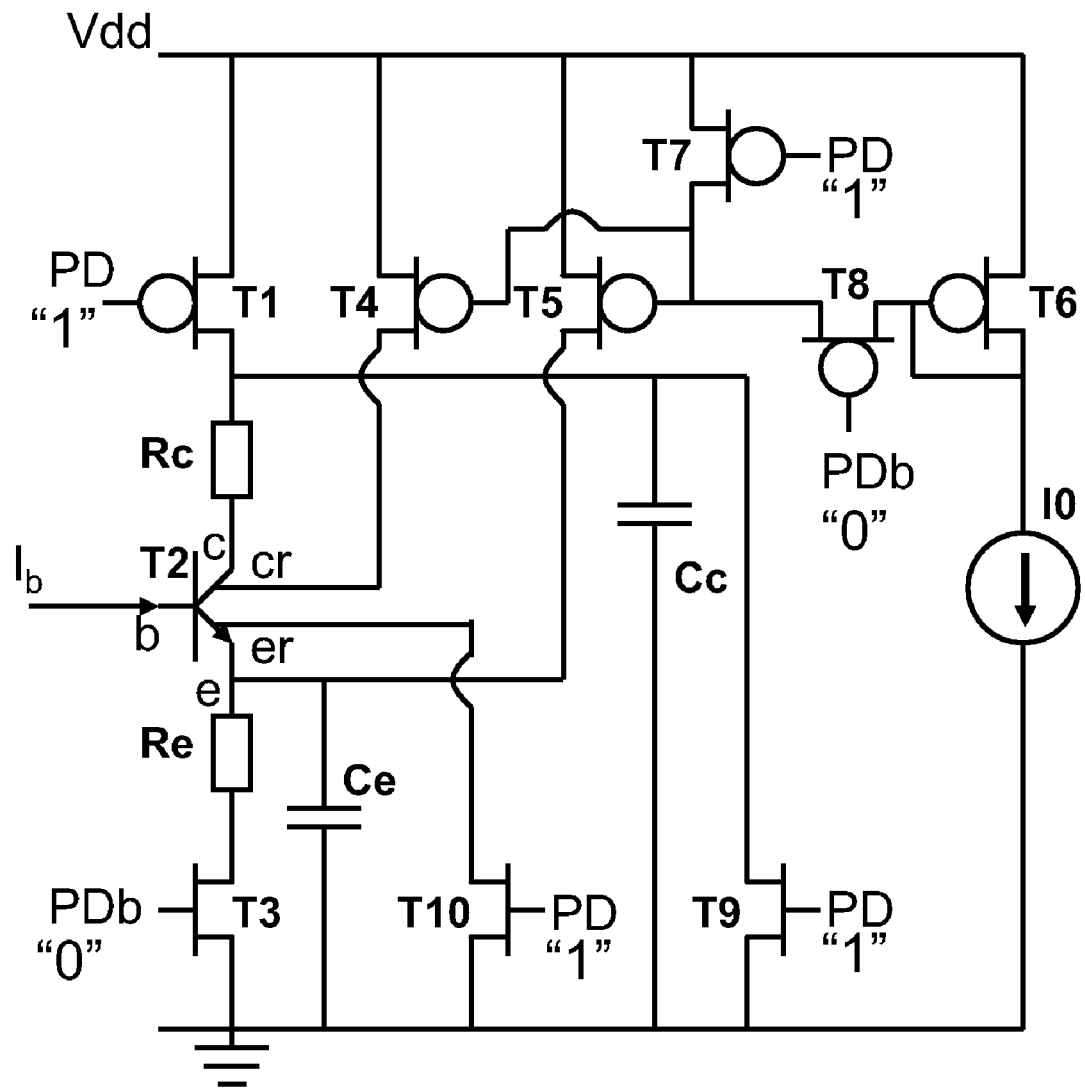
FIG. 8 is a simplified illustration of operation of the electric circuit shown in FIG. 6 during repair mode according to another embodiment of the present invention.

FIG. 8 is a simplified illustration of operation of the electric circuit shown in FIG. 6 during repair mode according to another embodiment of the present invention. More specifically, during this sleep mode or repair mode, logic signal PD is at a logic high ("1") level or state and its complementary counterpart PDb is at a logic low ("0) level or state. Thus, T1 and T3 may be turned off which causes the normal power supply Vdd-ground to be disconnected from T2. Under this state, the base current of T2 may be cut off as well. On the other hand, T8 is turned on while T7 is turned off which causes the current mirror being enabled. In the meantime, T9 and T10 are turned on, providing the repairing current paths. For example, repairing current for collector wire of T2 may flow from T4, through collector repair terminal (cr), collector terminal (c), resistant Rc, transistor T9, and finally to ground. The amount of repairing current for collector wire of T2 may depend on the mirror ratio of transistor T4 to T6, which is determined by the relative sizes of the devices, and also depend on current source I0. Further for example, repairing current for emitter wire of T2 may flow from transistor T5, through emitter (e), emitter repair terminal (er), transistor T10, and finally to ground. Here, it shall be noted that the actual electron flow (negative charge) shall be opposite to the current flow as described above, which is consistent with description above with reference to FIGS. 4 and 5. The amount of emitter repairing current depends on the mirror ratio of transistor T5 to T6, as well as current source I0.

Embodiments of the present invention further observe that, for a bipolar transistor, the base is generally the most sensitive terminal. However, since repairing current (either for the collector wire or the emitter wire) does not flow through the base and thus successfully avoids contacting the base, integrity of the base of the transistor will be preserved.

In FIG. 6, transistor T3 and resist Re are connected in series. According to one embodiment of the present invention, the size, in term of device width, of transistor T3 may be selected large enough so that the turn-on resistance of T3 is much smaller than Re, the resistance thus may be ignored, or the turn-on resistance of T3 may be counted as part of the emitter resistance required or designed. As a result, the introduction of transistor T3 will not impact performance of the circuit as it is originally expected.

During normal operation mode, T5 and T10 are turned off, and their equivalent circuits are a small parasitic capacitance which is in parallel with a capacitor Ce. Because it is usually more desirable to have a larger decoupling capacitance, in one embodiment of the present invention, the parasitic capacitance of T5 and T10 shall have minimal or no impact on the performance of the device. Similarly, T9 is in parallel with the decoupling capacitor Cc, the parasitic capacitance of T9

(when it is turned off in normal operation) has no impact. The parasitic capacitance of T4 (when it is turned off in normal operation) is connected to collector repair terminal (cr). Since generally parasitic capacitance of a MOSFET is small, the existence of parasitic capacitance of T4 shall not significantly impact the device performance. In addition, any impact may be further reduced by applying a smaller (in terms of device width) T4 and a large current source I0, and by increasing the resistance between collector c and collector repairing terminal cr.

Figure 9:
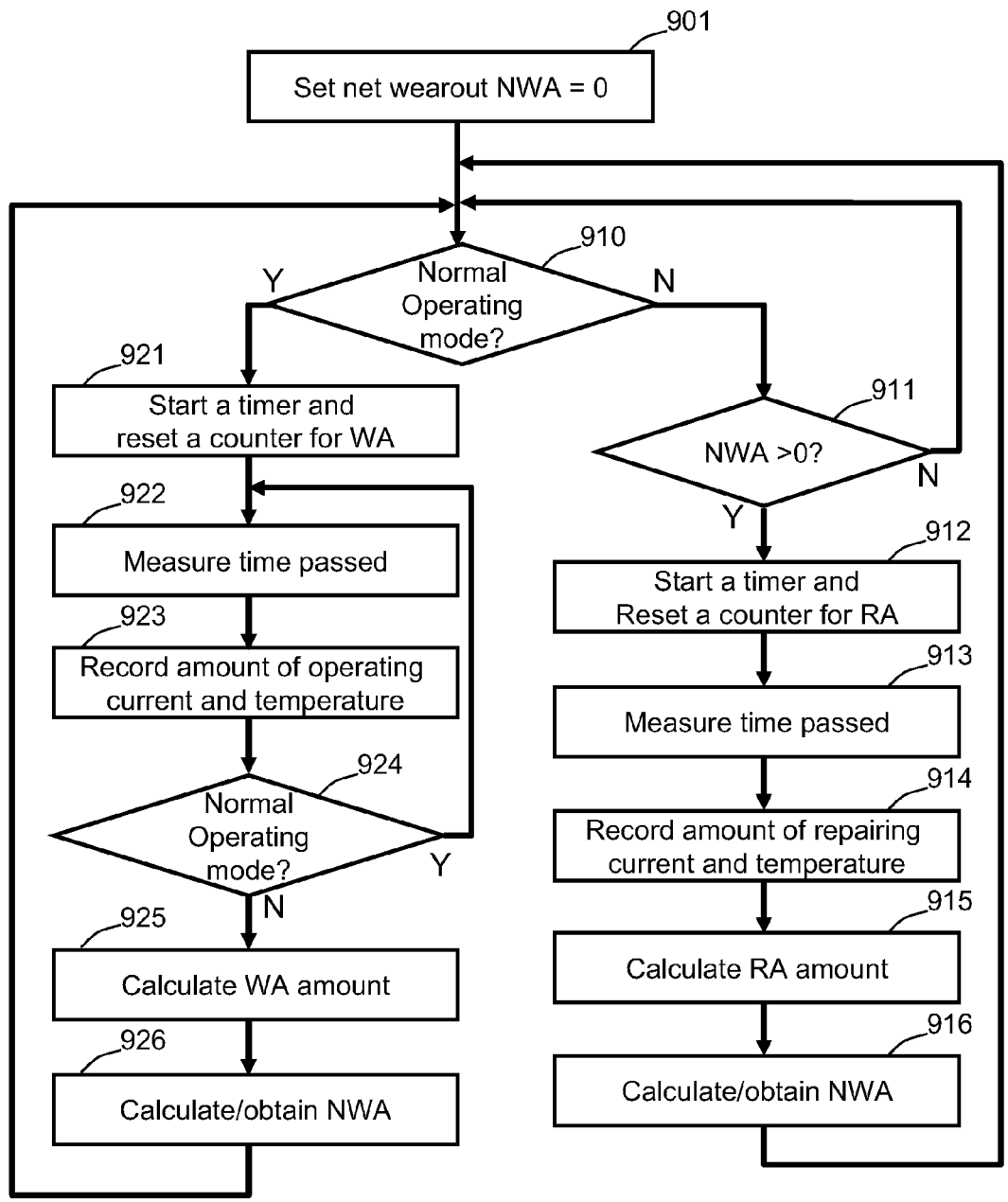
FIG. 9 is a simplified flowchart illustration of operations of a semiconductor device with repair functionality according to one embodiment of the present invention.

FIG. 9 is a simplified flowchart illustration of operations of a semiconductor device with repair functionality according to one embodiment of the present invention. In one embodiment, the method calculates a wearout amount (WA) of the semiconductor device, during a normal operating mode and a repair amount (RA) of the semiconductor device during a repair mode, and records a net wearout amount (NWA) by subtracting the repair amount (RA) provided during the repair mode from the wearout amount (WA) caused during the normal operating mode, as being described below in more details with reference to FIG. 9.

Various equations and/or criteria may be used to calculate and/or estimate the wearout amount (WA) and repair amount (RA). For example, according to one embodiment, WA may be calculated as a function of duration time, temperature, and electric current going through the semiconductor device during its normal operating mode, $$WA(t_{op}, Idc) = t_{op} \times Idc^n \times \exp\left(\frac{\Delta H}{Temp_{op}}\right),$$

where $Temp_{op}$ is the device temperature measured in Kelvin (K), Idc is the electric current level, e.g., an average DC current, going through the device, and $t_{op}$ is the time period when Idc is applied to the device during the normal operating mode. Additionally, n and $\Delta H$ may be constants related to the property of the conductive interconnect. For example, for aluminum (Al) interconnects, n is approximately 2 and $\Delta H$ is about 0.7, and for copper (Cu) interconnects, n is approximately 1 and $\Delta H$ is about 0.9. Similarly, RA may be calculated as $$RA(t_{rep}, Ip) = t_{rep} \times Ip^n \times \exp\left(\frac{\Delta H}{Temp_{rep}}\right),$$

where $Temp_{rep}$ is the device temperature measured in Kelvin (K), Ip is the repair current level going through the device, and $t_{rep}$ is the time period when Ip is applied to the device during the repair mode. Here, a person skilled in the art shall appreciate that embodiments of the present invention may not be limited with respect to calculating wearout amount and repair amount using the above equations, and other estimations or equations may be used as well.

According to one embodiment, operating the semiconductor device may include starting the operation with setting an initial net wearout amount, NWA, to zero (901). The method may continue to monitor operation status of the semiconductor device at step 910.

When it is detected that the semiconductor device is under normal operating mode, that is, PD is at a logic low ("0") level and PDb is at a logic high ("1") level, one embodiment of the method may start a timer for measuring time passing and reset (to zero) a counter for calculating the WA (921). The method may then proceed to record conditions of the semiconductor device during the normal operating mode by, for example, measuring time passed (922) and recording amount of operating current and temperature of the semiconductor device (923), and may continue doing so if the semiconductor device continues to be in the normal operating mode (924).

When it is detected that PD turns into a logic high ("1") level and PDb turns into a logic low ("0") level which indicates that the semiconductor device is no longer in its normal operating mode, one embodiment of the method may proceed to calculate the amount of WA accumulated during the immediate preceding period of time of operation (925) to reach a NWA, or add that amount of WA to any existing NWA to obtain a new NWA (926).

Once the semiconductor device comes out of its normal operating mode (910), according to one embodiment the method may proceed to verify whether the NWA or the new NWA at this stage is above a pre-determined value (911). According to one embodiment of the present invention, it may be decided that the semiconductor device shall not be overcompensated to have a negative NWA. If that is the case, then the pre-determined value shall be set to zero (911). Here, a person skilled in the art will appreciate that the present invention is not limited in this respect. For example, to certain extent and in some instances, a negative NWA may be permissible. In general, a person skilled in the art may set a preferable threshold, either positive or negative (in addition to zero), that triggers whether the semiconductor device shall be operated at its repair mode. If it is determined that the net NWA is less than the pre-determined value, embodiment of the method may return to continue monitoring the operation mode of the semiconductor device.

After confirming that the semiconductor device shall be operated at its repair mode based upon the detection of reaching a certain threshold of NWA (911), embodiment of the method may start a timer for measuring the time passing and reset (to zero) a counter for calculating the RA (912). The method may then proceed to record conditions of the semiconductor device during the repair mode, including measuring time passed (913) and recording amount of repairing current and temperature of the semiconductor device (914). Based upon the time, amount of repairing current, and temperature of the device, the repair amount (RA) may be calculated (915) using the equation provided above. Subsequently, the amount of RA is subtracted from the NWA to calculate a new NWA (916).

According to embodiment of the present invention, the method continues to verify whether the semiconductor device may continue to remain at repair mode (910), depending on whether the normal operation conditions have returned by, for example, looking at the logic levels of input signals PD and PDb. If the semiconductor device is still allowed to be operated at the repair mode, the method then proceed to verify whether the NWA, which is being updated continuously, has become lower than the pre-determined value, for example zero (911). If the NWA is still above the pre-determined value (or a pre-set threshold), the method may start another cycle of repair mode or continue a previously started repair mode. Here, a person skilled in the art will appreciate that various variation of operating the repair mode may be contemplated. For example, the duration of each repair mode may be adjusted based upon actual device application. Also for example, the monitoring of change in device operation mode may be performed on a continuing base, whether the device is actually under normal operating mode or repair mode. Further for example, the device repair mode may be operated continuously until a change of device operation mode or dropping below a pre-set threshold of NWA is detected.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of operating a semiconductor device, the method comprising:
   operating said semiconductor device for a first period of time at a normal operating mode;
   recording conditions of said semiconductor device during said first period of time;
   calculating a wearout amount (WA) caused during said first period of time at said normal operating mode;
   operating said semiconductor device for a second period of time at a repair mode after said first period of time at said normal operating mode, said repair mode being different from said normal operating mode;
   calculating a repair amount (RA) provided during said second period of time at said repair mode;
   recording a net wearout amount (NWA) by subtracting said RA from said WA;
   terminating said repair mode, if said NWA drops below a pre-determined value, making said second period of time shorter than a time period available from an end of said first period of time to a beginning of a third period of time; and
   operating said semiconductor device for said third period of time at said normal operating mode after said second period of time at said repair mode.

2. The method of claim 1, wherein operating said semiconductor device at said normal operating mode comprises applying an operating current in a first direction to said semiconductor device, and wherein operating said semiconductor device at said repair mode comprises applying a repairing current in a second direction to said semiconductor device with said second direction being opposite to said first direction.

3. The method of claim 2, wherein said semiconductor device includes a bipolar transistor having an emitter, a base, and a collector; and a collector wire (CW) having a first and a second end with said first end of said CW being connected to said collector, and
   wherein applying said operating current in said first direction comprises receiving said operating current from said bipolar transistor by said second end of said CW, through said collector and said first end of said CW, during said normal operating mode, and
   wherein applying said repairing current in said second direction comprises providing said repairing current from said second end of said CW to said first end of said CW during said repair mode.

4. The method of claim 2, wherein said semiconductor device includes a bipolar transistor having an emitter, a base, and a collector; and an emitter wire (EW) having a first and a second end with said first end of said EW being connected to said emitter, and
   wherein applying said operating current in said first direction comprises providing said operating current from said second end of said EW to said bipolar transistor, through said first end of said EW and said emitter, during said normal operating mode, and
   wherein applying said repairing current in said second direction comprises providing said repairing current from said first end of said EW to said second end of said EW during said repair mode.

5. The method of claim 2, wherein said semiconductor device includes a bipolar transistor having an emitter, a base, and a collector; and a collector wire (CW) having a first and a second end with said first end of said CW being connected to said collector, and
   wherein applying said operating current in said first direction comprises providing said operating current from said second end of said CW to said bipolar transistor, through said first end of said CW and said collector, during said normal operating mode, and
   wherein applying said repairing current in said second direction comprises providing said repairing current from said first end of said CW to said second end of said CW during said repair mode.

6. The method of claim 2, wherein said semiconductor device includes a bipolar transistor having an emitter, a base, and a collector; and an emitter wire (EW) having a first and a second end with said first end of said EW being connected to said emitter, and
   wherein applying said operating current in said first direction comprises receiving said operating current from said bipolar transistor by said second end of said EW, through said emitter and said first end of said EW, during said normal operating mode, and
   wherein applying said repairing current in said second direction comprises providing said repairing current from said second end of said EW to said first end of said EW during said repair mode.

7. The method of claim 1, wherein said semiconductor device includes a bipolar transistor having an emitter, a base, and a collector; and wherein operating said semiconductor device at said repair mode comprises heating said emitter with a poly wire heater disposed directly on top of said emitter of said bipolar transistor.

8. The method of claim 1, further comprising:
   calculating a new WA caused during said third period of time at said normal operating mode;
   calculating a new NWA by adding said new WA to said NWA; and
   operating said semiconductor device at said repair mode if said new NWA is above said pre-determined value at an end of said third period of time.

9. The method of claim 1, wherein said WA is calculated from said conditions recorded during said first period of time at said normal operating mode, said conditions including at least an amount of said operating current, a temperature of said semiconductor device during said normal operating mode, and a duration of said first period of time; and wherein said RA is calculated based upon at least an amount of said repairing current, a temperature of said semiconductor device during said repair mode, and a duration of said second period of time.

10. The method of claim 1, wherein said pre-determined value is zero.

11. A semiconductor device, comprising:
    a bipolar transistor having an emitter, a base, and a collector;
    an interconnect structure having at least a collector wire (CW), said CW having a first and a second end, said first end of said CW being connected to said collector; and
    a collector repairing wire (CRW) being conductively attached to said CW at substantially close to said first end of said CW,
    wherein said CW being conductive and adapted to provide an operating current in a first direction during a normal operating mode of said semiconductor device, and adapted to provide a repairing current in a second direction opposite to said first direction during a repair mode of said semiconductor device.

12. The semiconductor device of claim 11, wherein said first end of said CW is connected to said collector of said bipolar transistor vertically through a collector via in-between, and said CRW is substantially vertically aligned with said collector of said bipolar transistor.

13. The semiconductor device of claim 12, wherein said second end of said CW being adapted to receive said operating current from said bipolar transistor through said collector via and through said first end of said CW during said normal operating mode; and being adapted to provide said repairing current to said CRW through said first end of said CW during said repair mode.

14. The semiconductor device of claim 12, wherein said second end of said CW being adapted to provide said operating current to said bipolar transistor through said first end of said CW and through said collector via during said normal operating mode; and being adapted to receive said repairing current from said CRW through said first end of said CW during said repair mode.

15. The semiconductor device of claim 11, further comprising
an emitter wire (EW), said EW having a first and a second end, said first end of said EW being connected to said emitter; and
an emitter repairing wire (ERW) being conductively attached to said EW at substantially close to said first end of said EW.

16. The semiconductor device of claim 15, wherein said first end of said EW is connected to said emitter of said bipolar transistor vertically through an emitter via in-between, and said ERW is substantially vertically aligned with said emitter of said bipolar transistor.

17. The semiconductor device of claim 16, wherein said second end of said EW being adapted to provide said operating current to said bipolar transistor through said first end of said EW and through said emitter via during said normal operating mode; and being adapted to receive said repairing current from said ERW through said first end of said EW during said repair mode.

18. The semiconductor device of claim 16, wherein said second end of said EW being adapted to receive said operating current from said bipolar transistor through said emitter via and through said first end of said EW during said normal operating mode; and being adapted to provide said repairing current to said ERW through said first end of said EW during said repair mode.

19. The semiconductor device of claim 16, comprising a poly wire heater being disposed directly on top of said emitter of said bipolar transistor.

20. The semiconductor device of claim 19, wherein said poly wire heater being extended to have a first end and a second end, said emitter via being in contact with said first end of said poly wire heater, wherein said extended poly wire heater is adapted to provide said repairing current from said second end of said poly wire heater to said second end of said EW, through said first end of said poly wire heater; said emitter via; and said first end of said EW, during said repair mode.

21. The semiconductor device of claim 19, wherein said poly wire heater being extended to have a first end and a second end, said emitter via being directly on top of said first end of said poly wire heater, wherein said extended poly wire heater is adapted to provide said repairing current from said second end of said EW to said second end of said poly wire heater, through said first end of said EW; said emitter via; and said first end of said poly wire heater, during said repair mode.

22. An electric circuit, comprising:
at least one semiconductor device, said semiconductor device having a transistor device and an interconnect structure providing electric current to said transistor device, said interconnect structure having a collector wire (CW) connected to a collector of said transistor device and an emitter wire (EW) connected to an emitter of said transistor device, said EW having first and second ends with said first end being connected to said emitter of said transistor device through an emitter via in-between;
at least one current supplying circuit electrically connected to at least one of said CW and said EW; and
a poly wire heater being disposed directly on top of said emitter of said transistor device,
wherein said current supplying circuit is adapted to provide an operating current in a first direction and a repairing current in a second direction opposite to said first direction to said semiconductor device, through said at least one of said CW and said EW.

23. The electric circuit of claim 22, wherein said CW having first and second ends with said first end being connected to said collector of said transistor device and a collector repairing wire (CRW) being conductively attached to said CW at substantially close to said first end, said operating current being provided from said second end of said CW to said collector of said transistor device through said first end of said CW, and said repairing current being provided from said CRW to said second end of said CW through said first end of said CW.

24. The electric circuit of claim 22, wherein said CW having first and second ends with said first end being connected to said collector of said transistor device and a collector repairing wire (CRW) being conductively attached to said CW at substantially close to said first end, said operating current being received from said collector of said transistor device by said second end of said CW through said first end of said CW, and said repairing current being provided from said second end of said CW to said CRW through said first end of said CW.

25. The electric circuit of claim 22, wherein said EW having first and second ends with said first end being connected to said emitter of said transistor device and an emitter repairing wire (ERW) being conductively attached to said EW at substantially close to said first end, said operating current being provided from said second end of said EW to said emitter of said transistor device through said first end of said EW, and said repairing current being provided from said ERW to said second end of said EW through said first end of said EW.

26. The electric circuit of claim 22, wherein said EW having first and second ends with said first end being connected to said emitter of said transistor device and an emitter repairing wire (ERW) being conductively attached to said EW at substantially close to said first end, said operating current being received from said emitter of said transistor device by said second end of said EW through said first end of said EW, and said repairing current being provided from said second end of said EW to said ERW through said first end of said EW.

27. The semiconductor device of claim 22, wherein said poly wire heater being extended to have a first end and a second end, said emitter via being in contact with said first end of said poly wire heater, wherein said extended poly wire heater is adapted to provide said repairing current from said second end of said poly wire heater to said second end of said EW, through said first end of said poly wire heater; said emitter via; and said first end of said EW, during said repair mode.

* * * * *